United States Patent [19]

Patent Number: 5,468,296
Date of Patent: Nov. 21, 1995

Patrick et al.

[54] APPARATUS FOR IGNITING LOW PRESSURE INDUCTIVELY COUPLED PLASMA

[75] Inventors: Roger Patrick, Santa Clara; Philippe Schoenborn, San Jose; Mark Franklin, Scotts Valley; Frank Bose, San Jose, all of Calif.

[73] Assignee: LSI Logic Corporation, Milpitas, Calif.

[21] Appl. No.: 169,571

[22] Filed: Dec. 17, 1993

[51] Int. Cl.⁶ ................................. C23C 16/00
[52] U.S. Cl. ................... 118/723 MP; 118/723 I
[58] Field of Search ............ 118/723 MP, 723 I; 156/345; 201/298.06, 298.34, 298.08; 315/111.21, 111.51, 111.81, 111.91

[56] References Cited

U.S. PATENT DOCUMENTS

| | | | |
|---|---|---|---|
| H566 | 1/1989 | Nyaiesh | 427/38 |
| 4,557,819 | 12/1985 | Meacham et al. | 204/298 |
| 4,664,938 | 5/1987 | Walker | 427/39 |
| 4,804,431 | 2/1989 | Ribner | 156/345 |
| 4,863,559 | 9/1989 | Douglas | 156/643 |
| 4,877,642 | 10/1989 | Gartner et al. | 427/38 |
| 4,891,118 | 1/1990 | Ooiwa et al. | 204/298 |
| 4,946,537 | 8/1990 | Huikata et al. | 156/345 |
| 4,948,458 | 8/1990 | Ogle | 156/643 |
| 4,957,590 | 9/1990 | Douglas | 156/643 |
| 5,006,760 | 4/1991 | Drake, Jr. | 315/111.21 |
| 5,032,221 | 7/1991 | Roselle et al. | 156/643 |
| 5,078,823 | 1/1992 | Chollet et al. | 156/345 |
| 5,171,401 | 12/1992 | Roselle | 156/643 |
| 5,183,775 | 2/1993 | Levy | 437/60 |
| 5,277,751 | 1/1994 | Ogle | 156/643 |
| 5,310,452 | 5/1994 | Doki | 156/643 |
| 5,346,578 | 9/1994 | Benzing | 156/345 |

*Primary Examiner*—Robert Kunemund
*Assistant Examiner*—Joni Chang
*Attorney, Agent, or Firm*—Poms, Smith, Lande & Rose

[57] ABSTRACT

An apparatus for producing a plasma suitable for semiconductor processing at pressures in the low millitorr range. The apparatus includes a vacuum chamber with a dielectric window, a generally planar coil disposed adjacent the window outside the chamber and coupled to an appropriate power source, and a plasma initiator disposed within the chamber. Once the plasma is initiated, the planar coil sustains the plasma by inductive power coupling. In one embodiment the plasma initiator is a secondary electrode disposed within the chamber and coupled to a second RF power source. In an alternative embodiment both the secondary electrode and a target pedestal are coupled to the secondary RE power source through a power splitter. In an alternative embodiment, the plasma initiator is used to ionize a portion of the process gas and provide a plasma that may then inductively couple with the planar coil. Initial ionization of the process gas may be achieved by use of an ultraviolet light source, an ultraviolet laser, a high voltage power source such as a tesla coil, or an electrical arc forming device such as a spark plug.

7 Claims, 4 Drawing Sheets

APPARATUS FOR IGNITING LOW PRESSURE INDUCTIVELY COUPLED PLASMA

BACKGROUND OF THE INVENTION

1. Field of the Invention

The present invention relates to methods and apparatus for producing low pressure plasmas suitable for use in semiconductor device processing. More particularly, the present invention concerns methods and apparatus for igniting low pressure plasma discharges.

2. Description of Related Art

A variety of semiconductor device processing techniques include exposure of a semiconductor wafer to some form of plasma. Semiconductor wafer etching, passivation, and deposition processes, for example, typically involve exposing the semiconductor wafer to a plasma formed from some appropriate process gas. The plasma is normally formed at low pressures by the transfer of kinetic energy from excited electrons within the plasma to the molecules of the process gas through individual collisions between the electrons and the gas molecules. Energy is usually imparted to the electrons from a power source by capacitive coupling, inductive coupling, or both. Capacitive coupling relies on the generation of an electric field within the plasma to accelerate the electrons, while inductive coupling additionally involves the use of an oscillatory magnetic field to excite the electrons. Inductive coupling also restricts the linear motion of the electrons with the resultant effect of improving plasma containment and density.

Typically processing of a semiconductor wafer with a plasma is performed in a partially evacuated chamber. Considerable effort has been directed to enhancing the transfer of energy from electrons within the plasma to the molecules of the process gas, while minimizing the effect of the electrons and the ions on the semiconductor wafer itself. Once common form of capacitive energy transfer, for example, involves the application of a radio frequency (RF) electric field between two parallel plates disposed within the plasma chamber and oriented parallel to the wafer. This approach, however, suffers from a number of disadvantages. At low operating pressures a substantial portion of the energy imparted by the electric field to the plasma is typically dissipated through collisions with the structure of the plasma chamber, or collisions with the silicon wafer itself. Because of these collisions with the wafer, limitations are imposed on the operating conditions of the process to avoid harm to the semiconductor. The semiconductor wafer may also be adversely affected by increases in thermal temperature, a further consequence of electron and ion collisions with the wafer. Thus plasma processing techniques relying on the application of a RF electric field to a plasma are usually limited to certain pressure ranges, commonly above about 0.01 torr, and are typically employed only in combination with the application of a very high frequency RF electric field.

To increase the efficiency of plasma generation by capacitive coupling, microwave resonance type plasma, generations have been developed, employing ultra high cavity frequencies on the order of 2.45 gigahertz. These high frequencies increase the likelihood of transferring electron energy to the process gas molecules, rather than the plasma chamber or the semiconductor wafer, by decreasing the oscillatory path of the electrons. Another approach, termed electron cyclotron resonance, employs a controlled magnetic field to induce a circular electron flow path within the process gas. Still another approach to capacitively coupled plasma generation employs a large and uniform magnetic field oriented parallel to the surface of a semiconductor wafer in combination with a high frequency RF field oriented perpendicular to the semiconductor wafer. The combination of these two fields imparts a cycloidal flow path to the electrons, thus increasing the probable distance travelled by the electrons before collision with the chamber or the wafer.

As noted above, inductively coupled plasma generating systems primarily employ oscillating magnetic and fields to impart energy to electrons within a plasma chamber. Inductively coupled systems are typically configured much like a transformer, with one coil of the transformer located outside the plasma chamber and with an electron stream within the plasma forming the second coil of the transformer as the electrons travel in a generally closed path through the process gas. One form of conventional inductively coupled plasma generator is disclosed in U.S. Pat. No. 4,948,458 to John Ogle ("the '458 system"). This generator normally provides a plasma deemed suitable for a variety of semiconductor wafer processing methodologies. The '458 system includes a chamber with a dielectric window and a planar coil disposed outside the chamber adjacent the window. A resonant RF current is induced in the planar coil, which in turn produces a magnetic field within the chamber to create a stream of circulating electrons, and thus a plasma, in a plane parallel to the exterior coil. While generally considered suitable for the plasma treatment of semiconductors over a relatively broad range of operating pressures, initial ignition of a plasma in this system may be difficult at pressures in the low millitorr range. In applications where a lower process pressure is desired, the plasma must first be initiated at a higher pressure and then reduced to a lower operating pressure. There still exists a need, however, for a plasma generator capable of creating highly uniform plasmas over a broad range of operating pressures. The present invention fulfills this need.

SUMMARY OF THE INVENTION

Broadly, and in general terms, the present invention provides a plasma generator suitable for processing semiconductor wafers across a wide range of operating conditions, including process pressures in the low millitorr ranges below 5 millitorr. In one embodiment the plasma generator of the present invention includes a vacuum chamber having a dielectric window, a generally planar coil disposed outside the chamber adjacent the window, and means for initiating a plasma discharge within the chamber at low pressures. The inventors have determined that the conventional methodology of increasing the quantity of the process gas within a plasma chamber to pressures sufficiently high to initiate a plasma discharge, and then the lowering the pressure to a desired operating range, may be unsuitable for some semiconductor wafer processing applications. Applicants have determined the existence of a variety of process applications in which exposure of a semiconductor wafer to a plasma for a short period is desired. In such instances, degradation of the semiconductor process may result from use of the conventional procedure of initiating a plasma at a higher pressure and then reducing the operating pressure to a desired range. If the operating pressure is reduced too rapidly the plasma may extinguish, resulting in a loss of the silicon wafer. Typically the chemical processing being performed by plasma exposure cannot be restarted with sufficient precision to accomplish the desired processing within tolerances. Reduction of the operating pressure at a sufficiently slow rate to avoid loss of the plasma, however, may preclude optimum processing of the semiconductor wafer, and additionally reduces control over the plasma processing step.

The plasma generating apparatus of the present invention includes apparatus suitable for initiating a plasma discharge within the vacuum chamber at operating pressures in the low millitorr range, despite inadequate capacitive or inductive coupling between the process gas and the generally planar coil. In one embodiment, the plasma generator of the present invention includes a secondary electrode disposed within the vacuum chamber and electrically coupled to a second RF power source disposed outside the chamber. In operation, a desired operating pressure is achieved within the vacuum chamber of the plasma generator and RF power applied to the planar coil disposed outside the vacuum chamber so as to establish a highly uniform and intense magnetic field within the chamber adjacent the dielectric window. RF power is also delivered to the second electrode to increase the energy of existing free electrons. The secondary electrode may be coupled to the planar coil disposed outside the vacuum chamber, the grounded walls of the vacuum, or a support pedestal on which the semiconductor wafer resides. In an alternative embodiment separate radio frequency power sources may be coupled to both the wafer support pedestal and to the second electrode so as to enhance capacitive coupling between the second electrode and the wafer support pedestal. In another alternative embodiment, a single radio frequency power source is coupled to both of the second electrode and the wafer support pedestal through a power splitter. A phase delay is may be introduced between the power splitter and either of the second electrode or the wafer support pedestal to achieve optimum capacitive coupling.

In yet another alternative embodiment, the plasma generator of the present invention includes the use of a device suitable for ionizing some of the process gas within the vacuum chamber so as to provide a low density plasma that may then inductively couple to the magnetic field generated by the generally planar coil disposed exterior to the vacuum chamber. In one embodiment, the vacuum chamber is provided with a window that is transmissive to ionizing radiation, such as ultraviolet light. An ionizing light source, such as an ultraviolet laser or a broad band light source such as a flash lamp is then employed to ionize some of the process gas within the vacuum chamber and provide a low density plasma for inductive coupling with the planar coil disposed exterior to the vacuum chamber. In an alternative embodiment, an output electrode of a tesla coil is disposed within the vacuum chamber. In this latter embodiment, some of the process gas is ionized by the formation of an arc between the tesla coil rod and the grounded walls of the vacuum chamber. In still another embodiment of the present invention, a pair of conductive electrodes are disposed within the vacuum chamber and coupled to a high-voltage source exterior to the chamber to again ionize some of the process gas within the vacuum chamber by the formation of an electrical arc between the electrodes.

The novel features which are believed to be characteristic of the present invention will be better understood in the following detailed description, considered in connection with the accompanying drawings. It should be expressly understood, however, that the drawings are for purposes of illustration and description only and are not intended as a definition of the limits of the present invention.

DETAILED DESCRIPTION OF THE PREFERRED EMBODIMENTS

Figure 1:
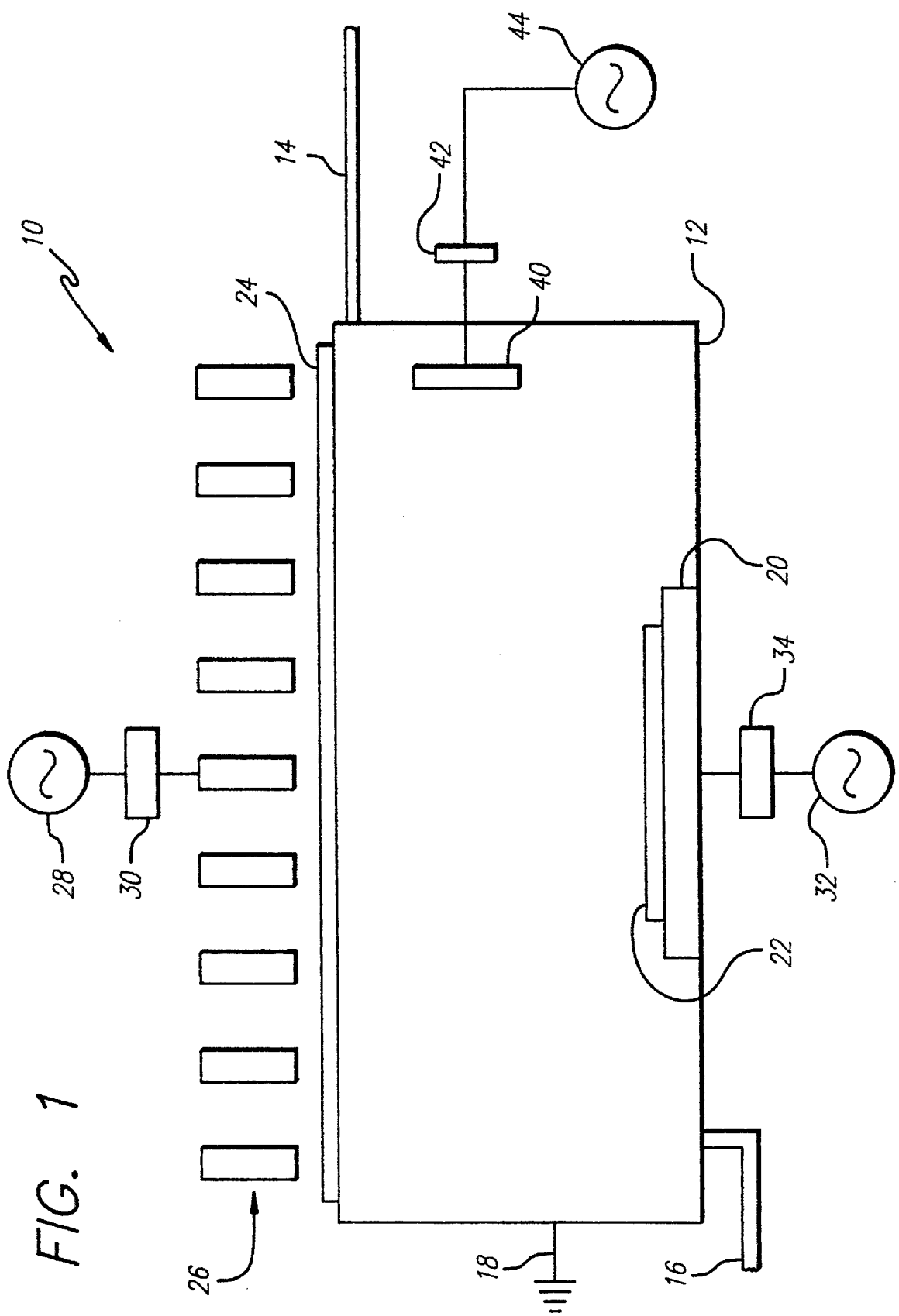
FIG. 1 is a schematic side view illustrating a first embodiment of the plasma generator of the present invention for initiating a plasma through capacitive coupling.

Referring to the figures, and more particularly FIG. 1, there is shown in schematic side view one preferred embodiment of the low pressure plasma generating apparatus 10 of the present invention. As illustrated, the apparatus 10 includes a vacuum chamber 12 having a gas inlet line 14 and a vacuum exhaust outlet line 16. The vacuum chamber 12 is preferably composed of a nonconductive material, such as an anodized metal grounded by an appropriately configured ground line 18.

Disposed within the vacuum chamber 12 is a target pedestal 20 for supporting one or more semiconductor wafers 22. One surface of the vacuum chamber 12 opposite to and generally parallel with the pedestal 20 defines an aperture within which a dielectric window 24 is disposed. This dielectric window 24 may be composed of quartz or some other suitable dielectric material such as various nonconductive ceramics known in the electromagnetic arts. A generally planar coil 26 is further disposed outside the vacuum chamber 12 adjacent the dielectric window 24. This coil 26 provides the primary source of power to sustain by inductive coupling a plasma within the vacuum chamber 12. The dielectric window 24 provides an atmospheric seal with the vacuum chamber 12 that is generally transmissive to an electromagnetic field generated by the coil 26. To enhance the uniformity of the plasma generated within the vacuum chamber 12 the coil 26 is generally planar, with deviations in flatness of preferably, but not necessarily, less than one to two-tenths of the diameter of the coil. The coil 26 may further form a spiral configuration or, alternatively, a series of interconnected concentric rings. The diameter of the coil 26 is typically dependent upon the size of the plasma desired. In one embodiment a coil 26, intended for sustaining a plasma of sufficient size to treat a single semiconductor wafer, has a diameter of 13 to 18 centimeters with 5 to 8 spiral turns or concentric rings provided to produce a relatively uniform plasma within the vacuum chamber 12 that extends essentially across the entire diameter of the coil 26. Preferably, the coil 26 is composed of a highly conductive metal, such as copper, having a sufficient cross-sectional diameter to accommodate currents of up to approximately 30 amps.

Power is provided to the coil 26 by a radio frequency (RF) power source 28. The power source 28 may be inductively coupled to the coil 26 by a matching circuit 30, or by some other appropriate circuitry known in the electrical arts. In one embodiment, this matched circuit includes a primary coil coupled to the RF power source 28 and a secondary loop coupled to the inner and outer ends of the coil 26 in series with a variable capacitor. As is known in the electrical arts, the primary coil and secondary loop may be orientable with respect to one another to allow for circuit loading at a desired operating frequency of the power source 28. The variable capacitor in series with the secondary loop further permits adjustment of the resonant frequency of the circuit to match the frequency output of the power source 28. The RF power source 28 preferably, but not necessarily, has a power output of about 500 watts in the megahertz frequency range with an RMS voltage output of about 70,000 volts.

Typically a plasma sustained by the apparatus illustrated in FIG. 1 and discussed above will have a velocity vector oriented generally parallel to the surface of the semiconductor wafer 22 within the vacuum chamber 12. In order to impart a component to the velocity vector of the plasma species that is oriented perpendicular to the surface of a semiconductor water 22, the pedestal 20 may be coupled to a separate RF power source 32 through an additional matching circuit 34.

In operation, the vacuum chamber 12 is pumped to a desired operating pressure with a process gas being introduced into the vacuum chamber 12 through the inlet 14. A plasma is then initiated within the vacuum chamber 12. Inductive coupling between the coil 26 and the process gas can sustain the plasma once it is initiated. Plasma initiation typically cannot be achieved by inductive coupling between the coil 26 and the process gas at pressures in the low millitorr range. The inventors have determined, however, that damage may be imparted to semiconductor wafers intended for plasma treatment at pressures in the low millitorr range if a plasma is first initiated at higher pressures and then reduced to a desired operating pressure in the low millitorr range, for example, 2–3 millitorr. As the operating pressure within the vacuum chamber 12 is reduced from an initial ignition pressure to a desired process pressure, care must be taken to avoid causing the plasma to extinguish. If this occurs, the wafer is effectively ruined and must usually be discarded. The inventors have found that plasma processing of a semiconductor wafer is typically dynamic in nature, and can not be successfully resumed if interrupted before completion. the inventors have further determined that substantially greater control of plasma reaction processing can be achieved by initially igniting the plasma reaction at pressures in the low millitorr range. By way of example, the present invention provides an apparatus for exposing a semiconductor wafer to a low pressure plasma in the two to three millitorr range for a period of thirty seconds or less. Conventional apparatus could not normally provide for plasma processing at such a low pressure and for such a brief exposure period. Typically conventional apparatus would require plasma ignition at a higher pressure that normally could not be reduced to the desired low millitorr range within the desired exposure period. Reducing the pressure to a desired low millitorr range more rapidly would likely increase the risk of the plasma extinguishing, with a resultant loss of the semiconductor wafer.

The present invention provides several alternative mechanisms for igniting a plasma within the vacuum chamber 12 at pressures in the low millitorr range, and well below those at which the coil 26 alone can ignite a plasma. In the embodiment of the present invention illustrated in FIG. 1, a secondary electrode 40 is included within the vacuum chamber 12 and coupled by a matched circuit 42 to a second radio frequency power source 44. This secondary electrode 40 is intended to increase the energy of free electrons that are already present in the process gas primarily by capacitive coupling. The inventors have determined that the extremely high resistive character of the dielectric window 24, and the concomitant voltage drop across this window, usually prevents sufficient capacitive coupling between the coil 26 and a process gas disposed within the vacuum chamber 12. By addition of the secondary electrode 40, however, sufficient capacitive coupling may be achieved by introduction of suitable RF energy from the second radio frequency power source 44 to achieve plasma ignition at pressures in the low 7 millitorr range, and in fact, within desired operating ranges of 2–3 millitorr.

In an alternative embodiment of the present invention capacitive coupling between the secondary electrode 40 may be enhanced by use of the separate RF power supply 32 coupled to the semiconductor wafer support pedestal 20 through the matching circuit 34. In operation, both the RF power source 44, coupled to the secondary electrode 40, and the separate RF power source 32 coupled to the wafer pedestal 20 are activated. The relative phase of the RF outputs from these two RF power sources, however, is initially set approximately 180° from one another. This phase separation can be selected to optimally enhance the capacitive coupling between the secondary electrode 40 and the pedestal 20, thus substantially increasing the energy transferred to free electrons already present in the process gas. Once a plasma is initiated within the vacuum chamber 12, the RF power source 44 coupled to the secondary electrode 40 may be deactivated and the phase of the separate RF power supply 32 coupled to the wafer pedestal 20 may be altered to optimize coupling between the pedestal 20 and the generally planar coil 26 disposed exterior to the vacuum chamber.

Figure 2:
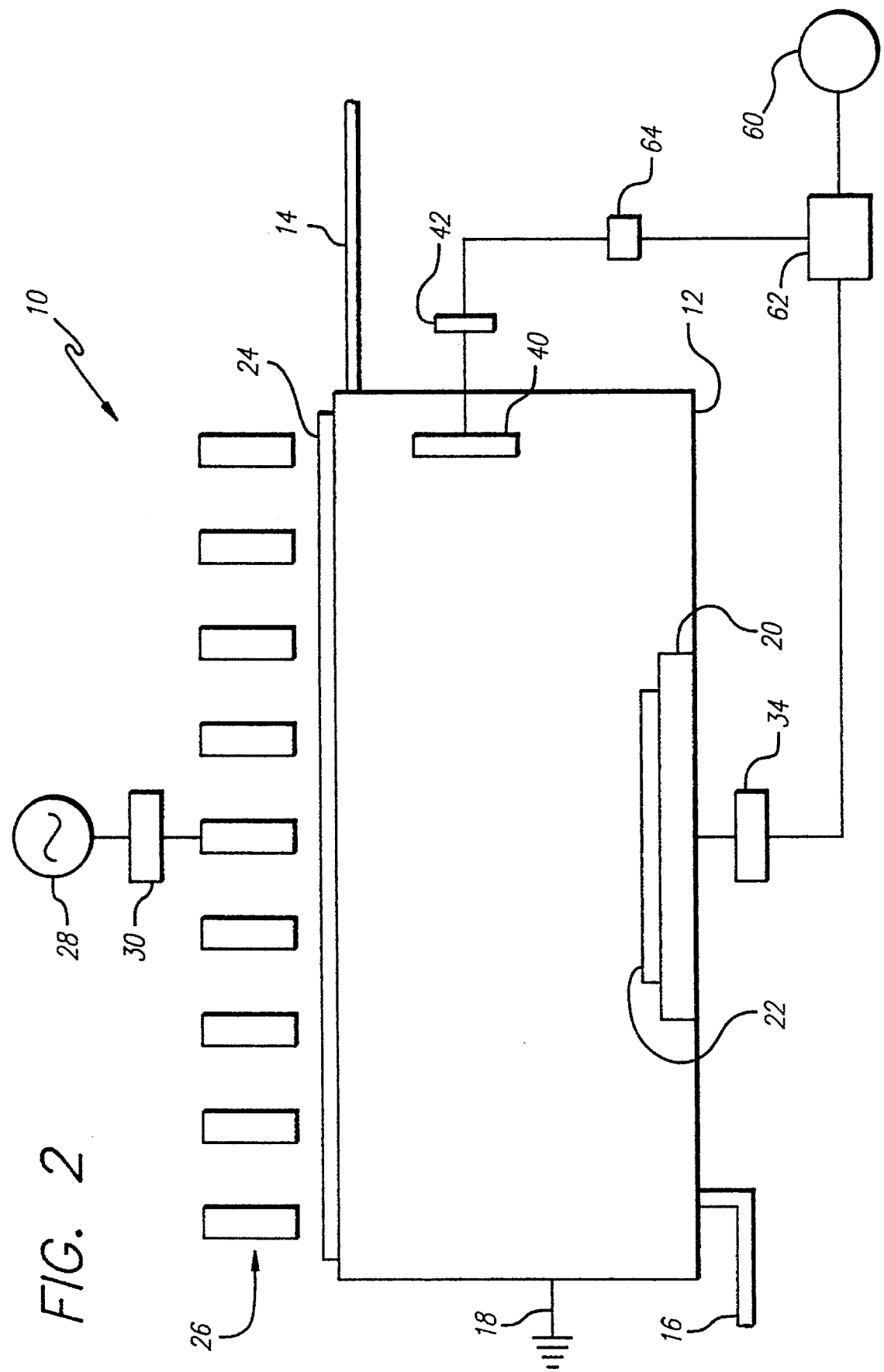
FIG. 2 is a schematic side view of alternative embodiments of the plasma generator of the present invention for initiating a plasma through capacitive coupling.

In a further alternative embodiment of the present invention, illustrated in FIG. 2, a single RF power supply 60 may be coupled to both the pedestal 20 and the secondary electrode 40 through a power splitter 62. A signal delay 64 may also beneficially be included between the power splitter 62 and either the pedestal 20 or the secondary coil 40. Preferably the power splitter 64 is variable so that the relative ratios of RF power provided to the pedestal 20 and the secondary electrode 40 may be varied. In operation, a desired operating pressure of the processing gas is obtained in the vacuum chamber 12 and the generally planar coil 26 disposed exterior to the vacuum chamber 12 is energized. RF power is then provided to the secondary coil 40 and the pedestal 20 to ignite a plasma within the process gas. The signal delay 40 is then preferably used to vary the relative phase of the RF power being applied to the secondary electrode 40 and the pedestal 20 so as to maximize capacitive coupling between the two elements. Once a plasma is initiated within the process gas, RF power flow to the secondary electrode may be terminated. The output of the RF power supply 60 may then be configured to optimize operation in cooperation with the generally planar coil 26.

Figure 3:
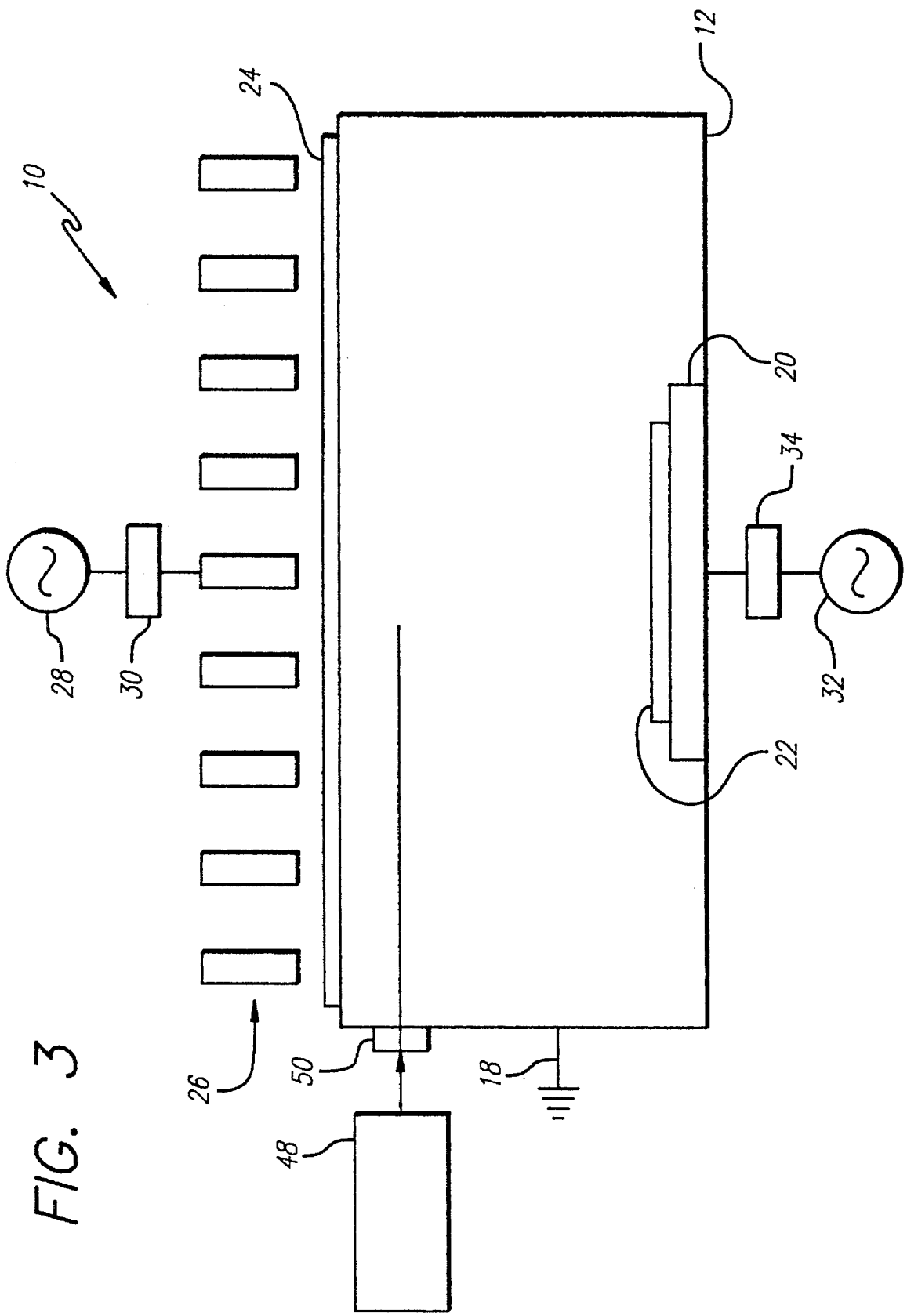
FIG. 3 is a schematic side view of an embodiment of the plasma generator of the present invention for initiating a plasma through ionization of some of a process gas.

An alternative embodiment of the present invention, illustrated in FIG. 3, employs a different approach to plasma ignition at pressures insufficient for plasma ignition by the coil 26 alone. In accordance with this aspect of the present invention, a plasma is first formed in the process gas by another ionizing mechanism. Once the process gas has been ionized, there is sufficient plasma species present to support inductive coupling with the primary coil 26. In the embodiment illustrated in FIG. 2, the process gas is initially ionized by introduction of an ionizing light beam from a source 48 exterior to the vacuum chamber 12. As illustrated, the vacuum chamber 12 is further provided with a window 50 that is transmissive to the ultraviolet portion of the electromagnetic spectrum. In certain instances where the desired operating pressures for the vacuum chamber 12 are substantially below 7 millitorr, further ionization of the process gas within the vacuum chamber 12 may be achieved by employing an ionizing light source.

Figure 4:
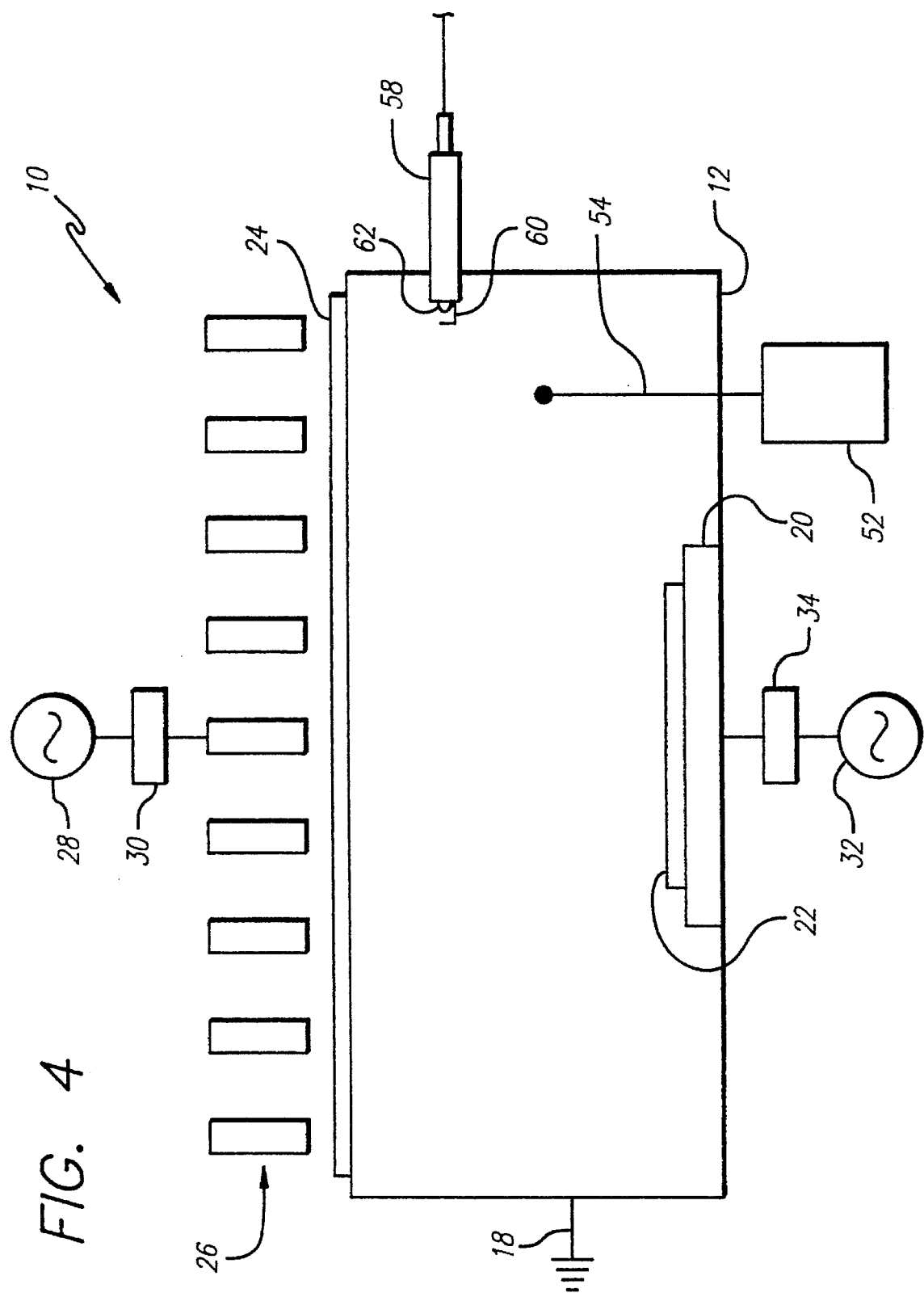
FIG. 4 is a schematic side view of further embodiments of the plasma generator of the present invention for initiating a plasma through ionization of some of a process gas.

Referring to FIG. 3, there is shown yet another alternative embodiment of the present invention. As discussed above in connection with the ultraviolet light source, plasma ignition is achieved by partially ionizing a portion of the process gas within the vacuum chamber 12 through some mechanism independent of the generally planar coil 26 that is used to sustain the plasma through inductive coupling. In one embodiment, this partial ionization of the process gas may be achieved by a tesla coil 52 having a high power output rod 54 disposed within the vacuum chamber 12. In operation, a high voltage at the end of the output rod 54 caused by operation of the tesla coil 52 would cause arcing in the process gas between the electrode 54 and the conductive walls of the vacuum chamber 12 grounded by line 18. As an alternative to the use of a tesla coil to provide electrical arc break-down within the process gas, a pair of electrodes having an extremely high potential between them could be employed by way of example, as further illustrated in Fig. 4, a spark plug 58 including electrodes 60 and 62 could be coupled to an appropriate high voltage source (not shown) to achieve a spark across the electrodes 60 and 62 of the spark plug 58 by conventional means.

The present invention provides a means of operating an inductively coupled plasma generating device capable of creating a highly uniform plasma across a wide range of operating pressures. As shown above, the present invention avoids disadvantages found to occur in conventional practices of initiating a plasma by raising the pressure of a process gas to a pressure sufficient to support plasma ignition and then gradually lowering the pressure to a desired operating range. It will, of course, be understood that various modifications and additions can be made to the preferred embodiments of the present invention. Accordingly, the scope of the present invention should not be limited by the particular embodiments discussed above, but should be defined only by the claims set forth below and equivalence thereof.

What is claimed is:

1. A plasma generation apparatus, comprising:
    a vacuum chamber, including a gas inlet, a vacuum outlet, and an aperture;
    a dielectric window disposed in the aperture and forming a substantially vacuum seal with the container;
    a substantially planar coil disposed outside the vacuum chamber adjacent the window;
    starter means for initiating a plasma discharge within the vacuum chamber at pressures in the low 5 millitorr range, wherein a plasma discharge within the chamber is initiated by said starter means and then maintained by energy provided to the plasma from the substantially planar coil;
    wherein said starter means includes an electrode disposed within the chamber and electrically coupled to an external power source, wherein a plasma discharge within the chamber is initiated at low pressures;
    a target pedestal disposed within the chamber and electrically coupled to said external power source; and
    an RF power splitter between the external power source, the target pedestal and the starter means electrode.

2. The plasma generation apparatus of claim 1 further including a phase delay between the power splitter and either of the starter means electrode and the target pedestal.

3. A plasma generation apparatus, comprising:
    a vacuum chamber, including a gas inlet, a vacuum outlet, and an aperture;
    a dielectric window disposed in the aperture and forming a substantially vacuum seal with the container;
    a substantially planar coil disposed outside the vacuum chamber adjacent the window;
    starter means for initiating a plasma discharge within the vacuum chamber at pressures in the low 5 millitorr range, wherein a plasma discharge within the chamber is initiated by said starter means and then maintained by energy provided to the plasma from the substantially planar coil;
    wherein said starter means includes ionizing means for partially ionizing a process gas with the container, wherein the plasma is subsequently sustained within the chamber by inductive coupling to the substantially planar coil; and
    wherein said ionizing means is a tesla coil including an output rod projecting into the chamber and electrically insulated from the chamber.

4. A plasma generation apparatus, comprising:
    a vacuum chamber, including a gas inlet, a vacuum outlet, and an aperture;
    a dielectric window disposed in the aperture and forming a substantially vacuum seal with the container;
    a substantially planar coil disposed outside the vacuum chamber adjacent the window;
    starter means for initiating a plasma discharge within the vacuum chamber at pressures in the low 5 millitorr range, wherein a plasma discharge within the chamber is initiated by said starter means and then maintained by energy provided to the plasma from the substantially planar coil;
    wherein said starter means includes ionizing means for partially ionizing a process gas with the container, wherein the plasma is subsequently sustained within the chamber by inductive coupling to the substantially planar coil; and
    wherein said ionizing means is a spark plug disposed within the chamber.

5. An apparatus for treating semiconductor wafers with a plasma comprising:
    a chamber including a gas inlet, a vacuum exhaust, and a dielectric window;
    a substantially planar coil disposed adjacent to and substantially oriented parallel with said dielectric window;
    a first power source coupled to said substantially planar coil;
    a secondary electrode disposed within the chamber;
    a second power source electrically connected to said second electrode, wherein plasma is initiated within the chamber by coupling between said secondary electrode and a process gas, and subsequently maintained by coupling between the process gas and the substantially planar coil;
    a target pedestal disposed within the chamber and coupled to said second power source; and
    an RF power splitter between the and power source, the secondary electrode and the target pedestal, and a phase delay between the power splitter and either of the electrode and the target pedestal.

6. A plasma generator for semiconductor processing, comprising:

a vacuum chamber including a gas inlet, an exhaust outlet, and a dielectric window;

a substantially planar coil disposed adjacent to and oriented substantially parallel with said dielectric window;

a first power source coupled to said substantially planar coil; and ionizing means for ionizing some of a process gas within the chamber, wherein a plasma is initiated within the chamber by ionization of a portion of said process gas and maintained by inductive coupling between the plasma and the substantially planar coil;

wherein said ionizing means is a tesla coil including an output rod projecting into the chamber and electrically insulated from the chamber.

7. A plasma generator for semiconductor processing, comprising:

a vacuum chamber including a gas inlet, an exhaust outlet, and a dielectric window;

a substantially planar coil disposed adjacent to and oriented substantially parallel with said dielectric window;

a first power source coupled to said substantially planar coil; and ionizing means for ionizing some of a process gas within the chamber, wherein a plasma is initiated within the chamber by ionization of a portion of said process gas and maintained by inductive coupling between the plasma and the substantially planar coil;

wherein said ionizing means is a spark plug disposed within the chamber.

* * * * *